(12) United States Patent
Wei et al.

(10) Patent No.: US 10,725,116 B2
(45) Date of Patent: Jul. 28, 2020

(54) AUTOMATIC SYSTEM GROUNDING CONDITION DETECTION

(71) Applicant: Rockwell Automation Technologies, Inc., Mayfield Heights, OH (US)

(72) Inventors: Lixiang Wei, Mequon, WI (US); Jiangang Hu, Grafton, WI (US); Jeffrey D. McGuire, Franklin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 15 days.

(21) Appl. No.: 15/861,886

(22) Filed: Jan. 4, 2018

(65) Prior Publication Data
US 2019/0204374 A1    Jul. 4, 2019

(51) Int. Cl.
*H02P 29/024* (2016.01)
*G01R 31/50* (2020.01)
*G06F 17/11* (2006.01)
*H02H 7/08* (2006.01)

(52) U.S. Cl.
CPC ............ *G01R 31/50* (2020.01); *G06F 17/11* (2013.01); *H02H 7/08* (2013.01); *H02H 7/0833* (2013.01); *H02P 29/024* (2013.01)

(58) Field of Classification Search
CPC ........ G01R 31/025; G01R 31/42; H02H 3/08; H02H 7/1225; B60L 3/0069; B60L 15/007; B60L 50/61; B60L 50/16; Y02T 10/7077; Y02T 10/645; Y02T 10/6217
See application file for complete search history.

(56) References Cited

U.S. PATENT DOCUMENTS

| | | | | |
|---|---|---|---|---|
| 4,878,142 A | * | 10/1989 | Bergman | G01R 31/025 361/80 |
| 5,909,367 A | | 6/1999 | Change | |
| 5,929,665 A | * | 7/1999 | Ichikawa | H01L 29/00 327/109 |
| 6,111,432 A | * | 8/2000 | Gerber | H04L 25/029 326/57 |
| 6,348,800 B1 | | 2/2002 | Haensgen et al. | |
| 6,381,113 B1 | * | 4/2002 | Legatti | H02H 3/335 361/46 |
| 6,984,988 B2 | | 1/2006 | Yamamoto | |

(Continued)

FOREIGN PATENT DOCUMENTS

| EP | 1914557 A2 | 4/2008 |
|---|---|---|
| EP | 2439827 A2 | 4/2012 |

*Primary Examiner* — Rina I Duda
(74) *Attorney, Agent, or Firm* — Fay Sharpe LLP

(57) ABSTRACT

A method and controller to automatically determine a grounding condition of a motor drive, in which an inverter is operated at a predetermined frequency while a load resistor is connected between a single phase of a motor drive inverter output and a reference node, a leakage flux linkage value is computed according to a neutral-ground voltage of the motor drive, and a processor determines whether the motor drive is solid grounded, high-resistance grounded, or floating according to the leakage flux linkage value. In certain examples, the processor automatically turns the inverter off while the load resistor is connected between the single phase of the inverter output and the reference node, and automatically determines whether the motor drive is delta corner grounded according to the neutral-ground voltage.

23 Claims, 8 Drawing Sheets

(56) References Cited

U.S. PATENT DOCUMENTS

| | | |
|---|---|---|
| 7,102,355 B1 | 9/2006 | Kumar |
| 7,199,988 B2 * | 4/2007 | Komori ............... H05B 41/2851 |
| | | 361/42 |
| 7,423,854 B2 * | 9/2008 | Gandolfi ................ H02H 3/14 |
| | | 361/42 |
| 7,498,819 B2 | 3/2009 | Kumar |
| 7,751,993 B2 | 7/2010 | Mirafzal |
| 7,933,108 B2 | 4/2011 | Tallam |
| 8,149,551 B2 | 4/2012 | Vedula |
| 8,154,890 B2 * | 4/2012 | Yasuda .................. H02M 1/32 |
| | | 363/34 |
| 8,319,466 B2 | 11/2012 | Valdez et al. |
| 8,478,552 B2 | 7/2013 | Morita et al. |
| 8,841,917 B2 * | 9/2014 | Wei ....................... G01R 31/42 |
| | | 324/509 |
| 2003/0197989 A1 * | 10/2003 | Nojima ................... B60L 3/00 |
| | | 361/47 |
| 2008/0232145 A1 * | 9/2008 | Hiller ................... H02H 7/1225 |
| | | 363/56.01 |
| 2009/0154034 A1 | 6/2009 | Tallam |
| 2010/0259099 A1 | 10/2010 | Vedula et al. |
| 2011/0153234 A1 | 6/2011 | Winterhalter et al. |
| 2011/0175619 A1 * | 7/2011 | Bauer ................... B60L 3/0069 |
| | | 324/510 |
| 2012/0086458 A1 | 4/2012 | Wei et al. |
| 2012/0112757 A1 | 5/2012 | Vrankovic et al. |
| 2012/0249038 A1 * | 10/2012 | Wei ....................... G01R 31/42 |
| | | 318/490 |
| 2013/0218491 A1 * | 8/2013 | Wei ....................... G01R 31/42 |
| | | 702/58 |
| 2015/0097571 A1 | 4/2015 | Wei |
| 2015/0188445 A1 * | 7/2015 | Tsutsui .................... H02H 3/08 |
| | | 363/37 |
| 2015/0355262 A1 | 12/2015 | Hu et al. |

* cited by examiner

United States Patent

AUTOMATIC SYSTEM GROUNDING CONDITION DETECTION

TECHNICAL FIELD

The subject matter disclosed herein relates to power conversion systems.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides methods and apparatus to automatically determine a grounding condition of a motor drive. An inverter is operated at a predetermined frequency while a load resistor is connected between a single phase of a motor drive inverter output and a reference node. A processor automatically computes a leakage flux linkage value according to a neutral-ground voltage of the motor drive, and determines whether the motor drive is solid grounded, high-resistance grounded, or floating according to the leakage flux linkage value. In certain examples, the processor automatically turns the inverter off while the load resistor is connected between the single phase of the inverter output and the reference node, and determines whether the motor drive is delta corner grounded according to the neutral-ground voltage.

BRIEF DESCRIPTION OF THE DRAWINGS

The following description and drawings set forth certain illustrative implementations of the disclosure in detail, which are indicative of one or more exemplary ways in which the various principles of the disclosure may be carried out. The illustrated examples are not exhaustive of the many possible embodiments of the disclosure. Various objects, advantages and novel features of the disclosure will be set forth in the following detailed description when considered in conjunction with the drawings, in which.

DETAILED DESCRIPTION

Figure 1:
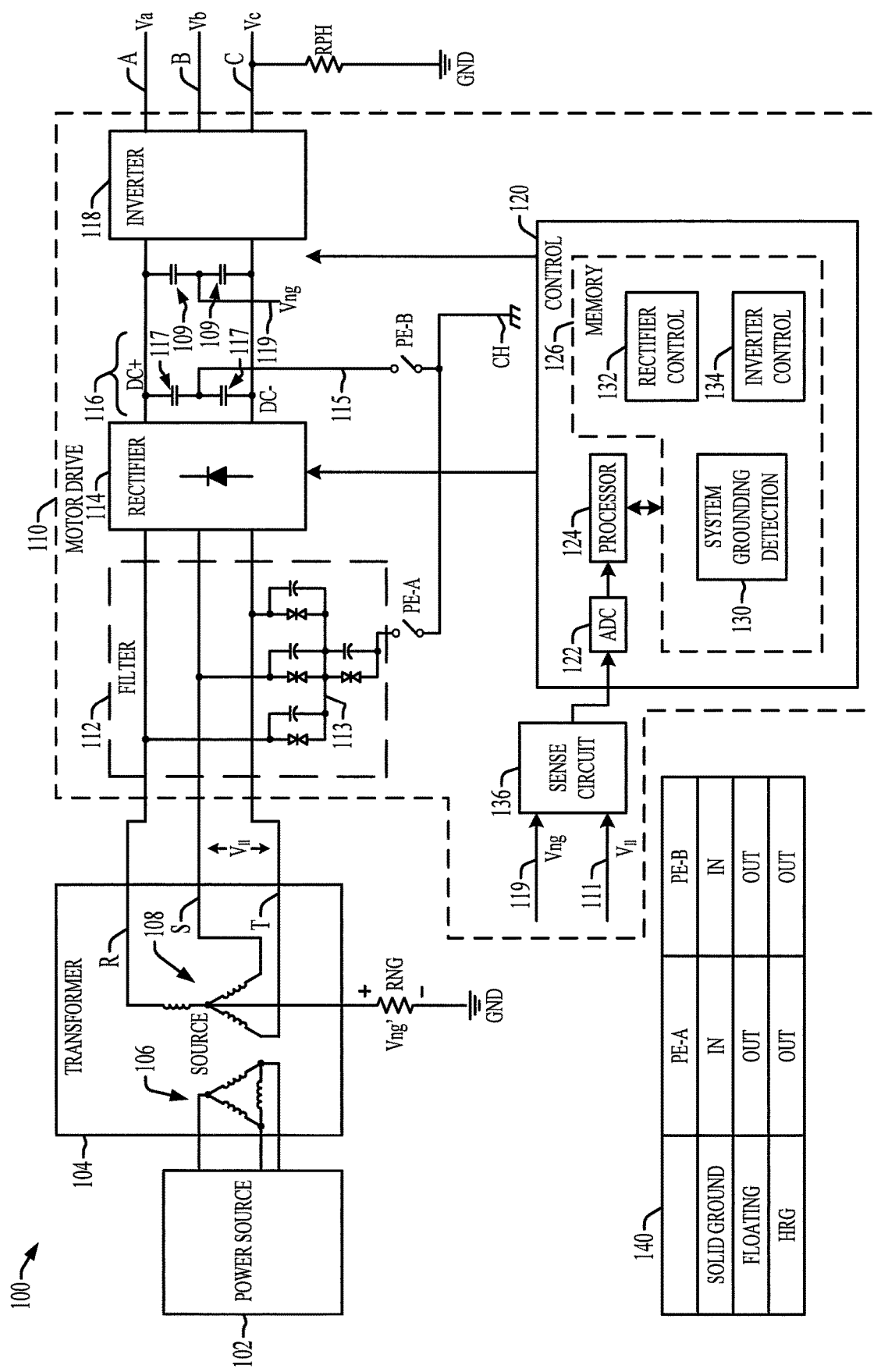
FIG. 1 is a schematic diagram.

Referring now to the figures, one or more example implementations are hereinafter described in conjunction with the drawings, wherein like reference numerals are used to refer to like elements throughout, and wherein the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " As used herein, the terms "couple", "coupled" and "couples" are intended to include indirect or direct electrical or mechanical connection or combinations thereof. For example, if a first device couples to or is coupled with a second device, that connection may be through a direct electrical connection, or through an indirect electrical connection via one or more intervening devices and connections.

Disclosed examples facilitate automatic detection of motor drive system or sub-system grounding schemes or conditions using the amplitude of a neutral to ground voltage and/or leakage flux linkage to identify the system grounding scheme. If an incorrect grounding scheme is used, a drive performance may be impacted and/or components may be degraded, particularly for high resistance grounding (HRG) systems. In certain disclosed examples, a resistor is connected between a single output phase and a reference node, such as chassis ground, and the drive automatically evaluates the neutral-ground voltage amplitude and/or the leakage flux linkage amplitude to identify the system grounding scheme, e.g., delta corner grounded, solid grounding, floating, high resistance grounding.

Figure 2:
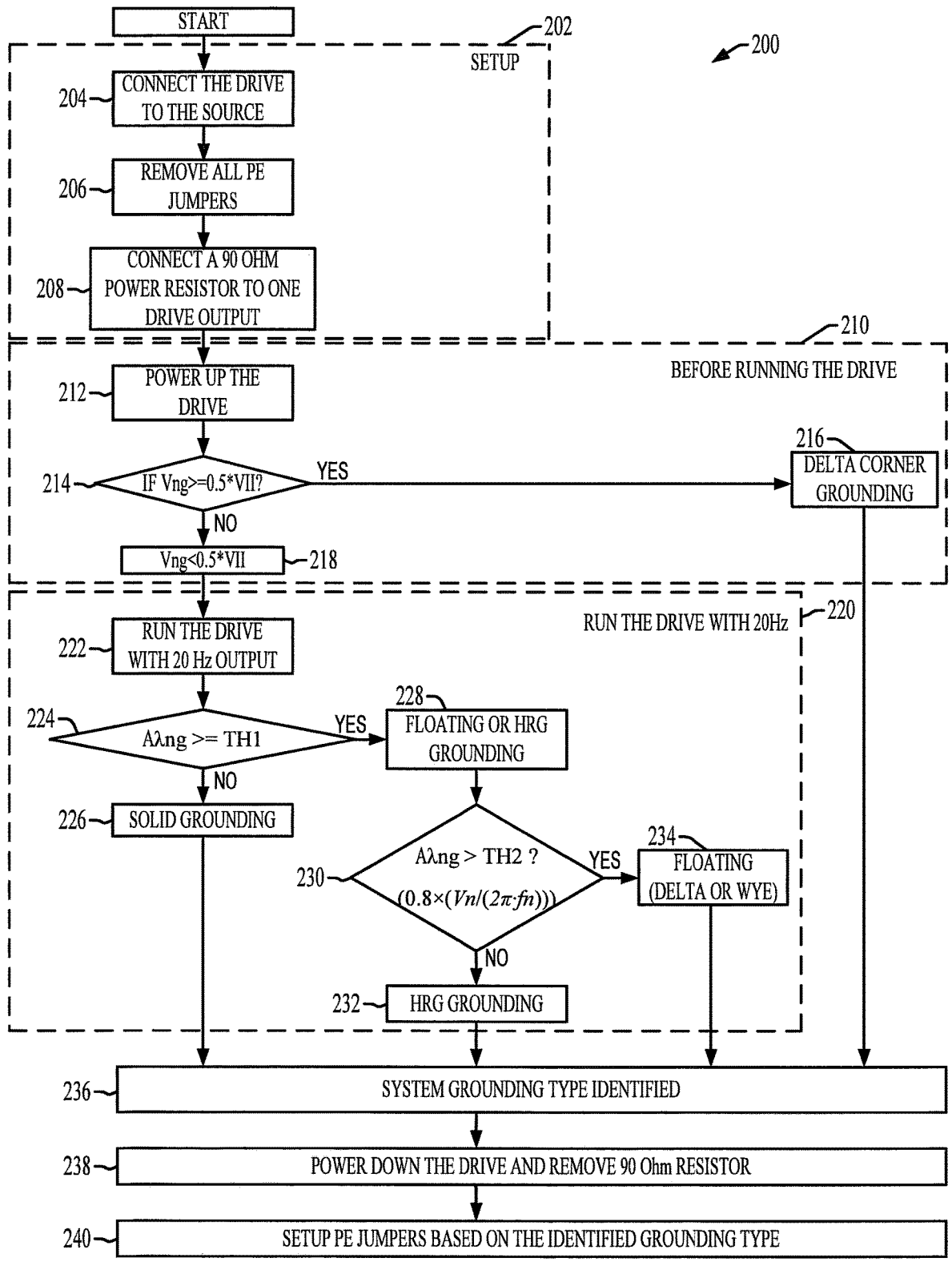
FIG. 2 is a flow diagram.

Referring now to FIGS. 1 and 2, FIG. 1 illustrates an example power conversion system 100 including a motor drive 110 with a controller 120, and FIG. 2 illustrates an example method 200 to automatically determine a grounding condition of the motor drive 110. The system 100 in FIG. 1 includes a power source 102 that provides single or multiphase AC input power to a primary winding or windings 106 of a transformer 104. The transformer 104 includes one or more secondary windings 108 to provide a single or multiphase AC input signals to a motor drive 110. The motor drive 110 includes a filter 112 with an input (e.g., R, S and T) that receives an AC input signal from the transformer secondary windings 108. The filter 112 has a three-phase output, and a filter neutral node 113. In one example, the input lines R, S and T are coupled to the neutral node 113 through corresponding circuits including back-to-back diodes and a parallel capacitor. The filter neutral node 113 in this example is connected to a first jumper PE-A through back-to-back diodes and a parallel capacitor. The first jumper PE-A is connected to a chassis or housing node CH. The motor drive 110 also includes a rectifier 114, with an input to receive a filtered AC signal from the filter 112, and an output to provide a DC bus voltage signal DC+, DC− to a DC bus circuit 116. The DC bus circuit 116 includes first and second DC bus capacitors 117 connected in series with one another and a DC bus internal node 115 that joins the DC bus capacitors 117. Neutral-to-ground voltage sensing capacitors 109 are connected in series across the DC bus to measure a DC bus a neutral-ground voltage Vng. A node 119 joins the sensing capacitors 109 and provides a neutral-ground voltage sense signal Vng. The node 115 forms a DC bus neutral node connected through a second jumper PE-B to the chassis or housing node CH. The motor drive 110 further includes an inverter 118 with an inverter input connected to the DC bus circuit 116, an inverter output A, B, C to provide output voltage signals Va, Vb and Vc to drive a motor load (not shown).

The motor drive 110 also includes a controller 120 configured to automatically determine a grounding condition of a motor drive 110. The controller 120 and the components thereof may be any suitable hardware, processor-executed software, processor-executed firmware, logic, or combinations thereof that are adapted, programmed, or otherwise configured to implement the functions illustrated and described herein. The controller 120 in certain embodiments may be implemented, in whole or in part, as software components executed using one or more processing elements, such as one or more processors 124. The controller 120 may be implemented as a set of sub-components or objects including computer executable instructions stored in the electronic memory 126 for operation using computer readable data executing on one or more hardware platforms such as one or more computers including one or more processors, data stores, memory, etc. The components of the controller 120 may be executed on the same computer processor or in distributed fashion in two or more processing components that are operatively coupled with one another to provide the functionality and operation described herein. The electronic memory 126 stores the program instructions 130, 132 and 134, and the processor 124 is configured to execute the program instructions. The controller 120 includes switch driver circuitry (not shown) to operate switches of the rectifier 114 and the inverter 118 according to rectifier and inverter switching control program instructions 132 and 134, respectively, executed by the processor 124.

The transformer secondary windings 108 in the illustrated example are connected in a "Y" configuration with a corresponding transformer neutral node connected through a resistor RNG to a ground reference node GND. In this configuration, a neutral-ground voltage Vng' is established across the resistor RNG that in certain configurations is equivalent to the voltage signal Vng at the node 119, and both these neutral-ground voltages are referred to hereinafter as "Vng". The filter input receives line-line voltage signals between respective pairs of the lines R, S and T, indicated in FIG. 1 as "Vl". The line-line filter input voltages are provided as an input 111 along with the neutral ground voltage signal Vng to a sense circuit 136 that provides an input to one or more analog-to-digital converter circuits (ADC) 122. The ADC circuit or circuits 122 provides a digital value to the processor 124 representing the neutral-ground voltage signal Vng and the line-line voltage signal $V_{ll}$. FIG. 1 further illustrates a table 140 showing different jumper configuration positions for the first and second jumpers PE-A and PE-B for solid grounding configuration, floating configuration and high resistance grounding (HRG) configuration of the system 100.

In accordance with one or more aspects of the present disclosure, the processor 124 executes system grounding detection program instructions 130 to automatically determine or detect a grounding condition of the motor drive 110 in the system. During automatic grounding condition detection operation, a load resistor RPH is connected between a single phase of a motor drive inverter output (A, B or C) and the reference node GND as shown in FIG. 1. In this configuration, the processor 124 executes the program instructions 130 in order to automatically determine the grounding configuration of the system 100.

FIG. 2 illustrates a process or method 200 to detect or determine the grounding configuration. In certain implementations, the processor 124 executes the program instructions 130 generally in accordance with the method 200. At 202, the system 100 is configured or set up for the automatic grounding configuration detection. At 204, the motor drive 110 is connected to the source 102 via the transformer 104, and all PE jumpers (PE-A and PE-B) are removed at 204. At 206, the resistor RPH is connected to one of the drive outputs A, B or C). In one example, the resistor RPH is a 90 ohm resistor (e.g., 300-500 Watts), although other resistance and wattage values can be used in different implementations. The value of 90 ohms advantageously facilitates differentiation between solid grounding, floating and HRG conditions of the system 100, particularly where potential HRG grounding resistors RNG are typically in the range of 27-277 ohms for 1-10 amp, 480 V motor drives 110.

The processor 200 continues at 210 before running the motor drive 110, including powering up the drive at 212. At 214, the processor 124 reads the neutral-ground voltage Vng at the circuit node 119 and the line-line voltage Vll at the motor drive input, for example, by obtaining digital converted values from the ADC representing the sensed neutral-ground and input line-line voltages via the sense circuit 136. Based on these values, the processor 124 executes the program instructions 130 to automatically determine whether the motor drive 110 is delta corner grounded according to the neutral-ground voltage Vng. The processor 124 makes a determination at 214 as to whether the neutral-ground voltage Vng is greater than or equal to half the line-line input voltage (e.g., whether Vng >0.5 Vll.). If so (YES at 214), the processor 124 automatically determines that the system 100 is configured in a delta corner grounding configuration at 216. At 236, the processor provides an indication to an operator of the identified system grounding type, for example, by displaying a grounding type indication on a user interface (not shown) and/or by sending a message to a host system (not shown) via a communications link between the motor drive 110 and the host system. At 238, the motor drive 110 is powered down, and an operator removes the load resistor PHM and sets the PE jumpers based on the identified grounding type at 238 and 240, respectively.

Otherwise (NO at 214), the neutral-ground voltage is determined to be less than half the line-line voltage at 218, and the processor 124 performs further verification or detection operations at 220. At 222, the processor 124 runs the drive including operation of the active rectifier 114 and the inverter 118 while the load resistor RPH is connected between the single phase of the inverter output and the reference node GND, with an inverter output frequency at a predetermined value, such as 20 Hz in one example.

At 224, the processor 124 continues to read the neutral-ground voltage value Vng via the sense circuit 136 and the ADC 122, and computes a leakage flux linkage value λng according to the neutral-ground voltage Vng of the motor drive 110. The processor 124 then determines whether the motor drive 110 is solid grounded, high-resistance grounded (HRG), or floating according to the leakage flux linkage value λng. In the illustrated example, the processor 124 makes a determination at 224 as to whether the leakage flux linkage value λng is greater than or equal to a first threshold value TH1. In one example, the first threshold value TH1 is 0.2 $(V_n/2\pi f_n)$, where $V_n$ is the drive nominal output phase voltage and $f_n$ is the drive nominal output frequency (e.g., 20 Hz in one example). Other values can be used for the first threshold value TH1. If λng is less than TH1 (NO at 224), the processor 124 automatically determines that the motor drive 110 is solid grounded at 226, and then proceeds to 236, 238 and 240 as described above.

If λng is greater than or equal to TH1 (YES at 224), the processor 124 determines at 228 that the system 100 is either floating or HRG grounded. In this case, the processor 124 makes a determination at 230 as to whether the leakage flux linkage value λng is greater than a second threshold value TH2, where the second threshold value TH2 is greater than the first threshold value TH1. In one example, the second threshold value THD2 is 0.8 $(V_n/2\pi f_n)$, although other values can be used for the second threshold value in different implementations. If λng is less than or equal to the TH2 (NO at 230), the processor 124 automatically determines that the motor drive 110 is high-resistance grounded HRG at 232, and the method 200 proceeds at 236-240 as described above. If instead the leakage flux linkage value λng is greater than TH2 (YES at 230), the processor 124 automatically determines that the motor drive 110 is floating (Delta or "Y") at 234. As with the other determinations, the processor 125 provides an indication at 236 as to the identified system grounding type, and the drive is powered down and the jumpers are set at 238 and 240 as previously described.

The controller 120 and the process 200 of FIG. 2 advantageously provide automatic system grounding condition detection or determination without the addition of any extra switches or contactors in the motor drive 110. The automatic grounding detection, moreover, advantageously avoids or mitigates the possibility of incorrect jumper settings for the PE jumpers (e.g., PE-A, PE-B) during drive system setup. In this regard, an incorrect grounding scheme including the settings of the jumpers PE-A and/or PE-B can lead to reliability and/or component degradation issues in operation of a motor drive 110. For instance, if either of the PE-A or PE-B jumpers is installed in an HRG grounded system, the drive 110 may suffer from excessive high-voltage (HV) stresses for the components and/or may suffer from DC bus voltage pump up issues.

The invention will re-use part of the existing High Resistance Grounding (HRG) detection technology to detect the system grounding during the commissioning phase. The only additional hardware part for the invention is a power resistor that connects the drive's output to chassis. The proposed method will use the amplitude of the drive's neutral to ground voltage and the amplitude/frequency of the leakage flux linkage to identify the system grounding scheme, e.g., solid grounding, floating, high resistance grounding.

Figure 3:
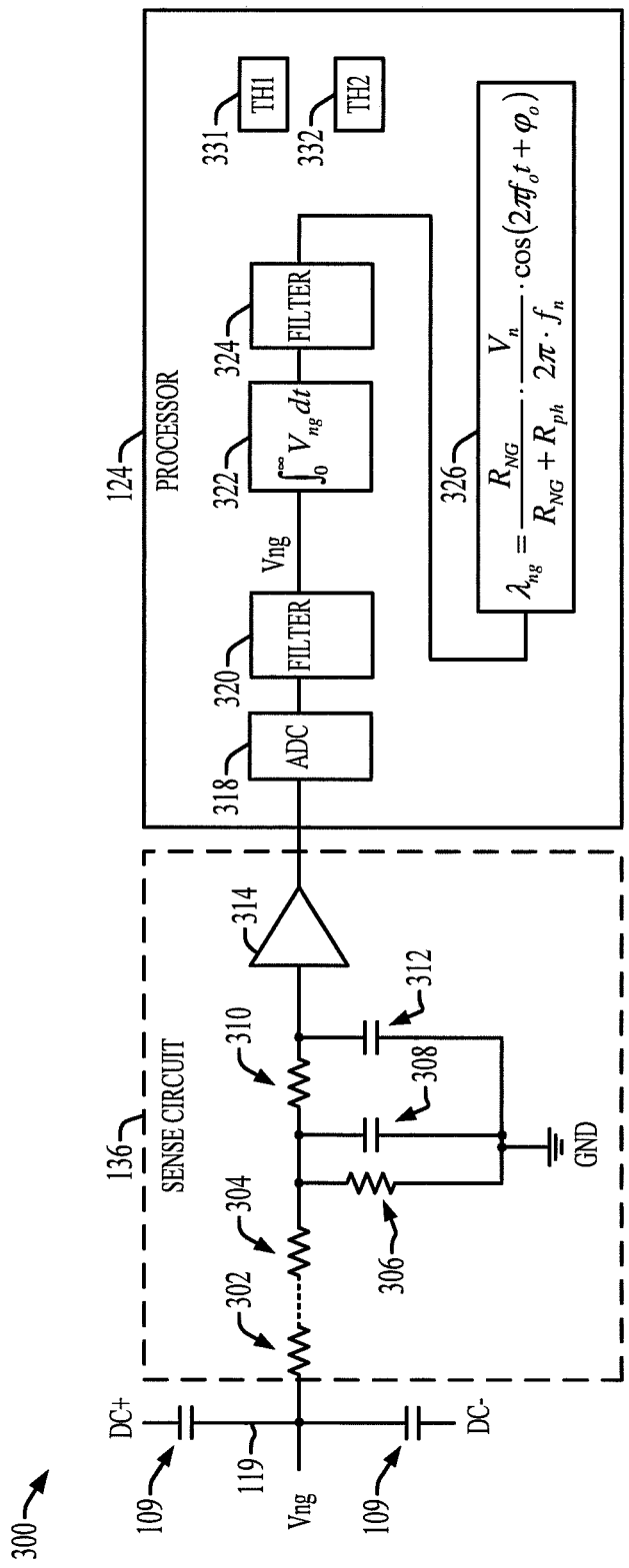
FIG. 3 is a schematic diagram.

FIG. 3 illustrates further details of one possible implementation of the sense circuit 136 including signal conditioning and amplification circuitry 302-314 for sensing the neutral-ground voltage sense signal Vng from the DC bus neutral sensing node 119, where similar sensing circuitry can be used for a second channel (not shown) to sense the line-line input voltage signal $V_{ll}$, and the sense circuit 136 can include an analog multiplexer in one example to share a single ADC 318 (122 in FIG. 1 above). In another possible implementation, to ADC circuits are used for the two input signals. In another implementation, as shown in FIG. 3, the ADC or ADCs 318 can be included in the processor 124. The sense circuit 136 in FIG. 3 includes two or more resistors 302, 304 and 306 to provide an input voltage divider, and a capacitor 308 is connected in parallel with the lower leg resistor 306. A further RC filter circuit is formed by a resistor 310 and a second capacitor 312, and a filtered signal is provided to an input of an amplifier 314. In this example, the amplifier output is provided to the ADC 318, and the processor 124 implements a digital filter 320 to provide a filtered neutral-ground voltage value Vng. This value is integrated by an integrator 322, and the output of the integration is filtered using a second digital filter 324. The filtered integrator output that provides a computed leakage flux linkage value λng 326, determined according to equation (4) below. As discussed above, the processor 124 compares the leakage flux linkage value λng with the threshold values 331 and 332 in order to automatically determine the grounding configuration of the power conversion system 100. In this example, the controller 120 uses the amplitude of the drive's neutral to ground voltage and the amplitude/frequency of the leakage flux linkage to identify the system grounding scheme. As discussed above in connection with FIG. 2, when Vng>=0.5$V_{ll}$, the system is Delta corner grounded, for example, where one corner of a delta-configured transformer winding is connected to the system ground referenced GND.

Figure 4:
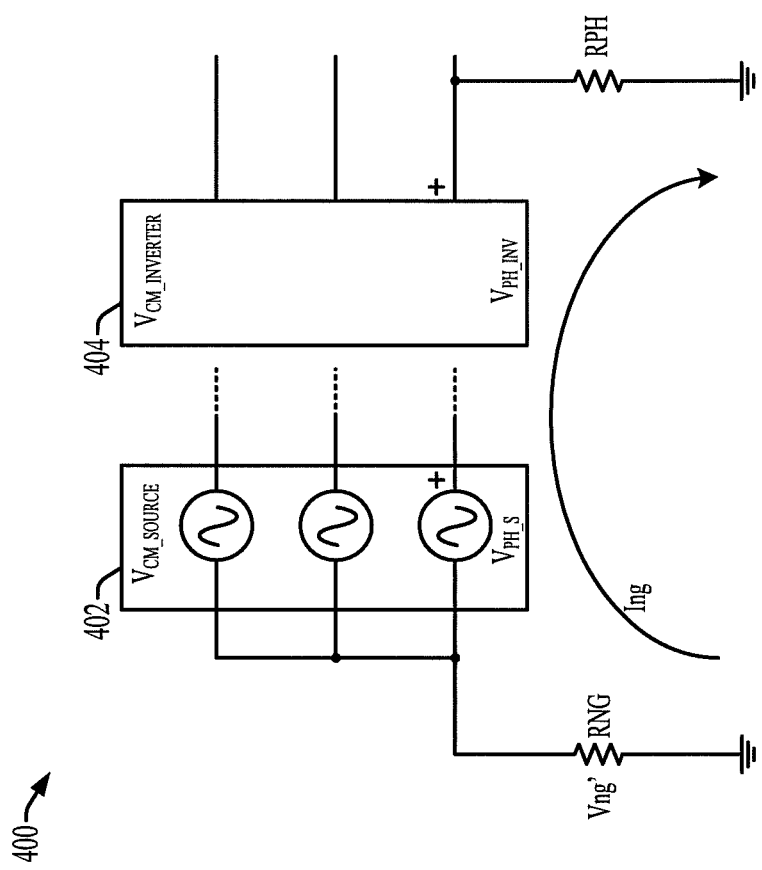
FIG. 4 is a schematic diagram.

Referring also to FIG. 4, when Vng <0.5 $V_{ll}$, the system grounding is either Wye solid grounding or Wye High resistance grounding, or floating (Wye/Delta). FIG. 4 illustrates an example configuration 400, showing the common mode voltage source 402 for a three phase system, and the inverter common mode voltage 404. In this example circuit, the neutral of the source is connected through the resistor RNG to ground to establish a source neutral-ground voltage Vng', and the common mode voltage source 402 provides a source phase voltage $V_{pH-s}$ for each of the input phases. The inverter common mode contribution 404 includes inverter phase common mode voltages $V_{PH-INV}$ for each output phase. FIG. 4 further illustrates a load resistor RPH connected between one of the output phases and the system ground connection. FIG. 4 also shows a corresponding neutral-ground current Ing flowing from the source through the load resistor RPH to ground. The controller 120 uses the leakage flux linkage computation to automatically identify the grounding configuration. The neutral-ground voltage Vng in the circuit 400 of FIG. 4 is represented by the following equations (1) and (2):

$$V_{ng} = -(V_{CM\_Source} + V_{CM\_Inverter}) \cdot \frac{R_{NG}}{R_{NG} + R_{ph}} \quad (1)$$

$$V_{ng} = -V_{ph} \cdot \frac{R_{NG}}{R_{NG} + R_{ph}} \quad (2)$$

In the above equations (1) and (2), $R_{NG}$ is the value of the neutral-ground resistor RNG and $R_{ph}$ is the value of the load resistor RPH in FIG. 4. In this regard, the system phase voltage $V_{ph}$ is proportional to the output frequency to maintain the constant flux linkage for motor control. Accordingly, the output phase voltage $V_{ph}$ of the motor drive 110 can be expressed according to equation (3) below, and equation (4) shows a further formulation of the neutral-ground voltage Vng in the circuit 400:

$$V_{ph} = \frac{V_n}{f_n} \cdot f_o \cdot \sin(2\pi f_o t + \varphi_o) \quad (3)$$

$$V_{ng} = -V_{ph} = -\frac{R_{NG}}{R_{NG} + R_{ph}} \cdot \frac{V_n}{f_n} \cdot f_o \cdot \sin(2\pi f_o t + \varphi_o) \quad (4)$$

where $V_n$ is the drive nominal output phase voltage, $f_n$ is the drive nominal output frequency, $f_o$ is the drive output frequency (e.g., 20 Hz), and $\varphi_o$ is the initial HRG fault sinewave angle (radians). For a constant motor flux linkage, an integration is applied to equation (4) to provide equation (5) below:

$$\int_0^\infty V_{ng} dt = C_1 + \frac{R_{NG}}{R_{NG} + R_{ph}} \cdot \frac{V_n}{2\pi \cdot f_n} \cdot \cos(2\pi f_o t + \varphi_o) \quad (5)$$

The leakage flux linkage value λng is shown in equation (6) below. λng can be interpreted as the motor flux linkage from the ground fault location. For example, using voltage/frequency (V/F) or flux vector mode operating conditions, the variable frequency motor drive 110 provides closed loop regulation to maintain constant flux linkage when the motor operates within the rated operating frequency range, where the amplitude of λng ($A_{\lambda ng}$ in equation (7) below) will remain generally constant over varying motor drive output frequencies.

$$\lambda_{ng} = \frac{R_{NG}}{R_{NG} + R_{ph}} \cdot \frac{V_n}{2\pi \cdot f_n} \cdot \cos(2\pi f_o t + \varphi_o) \quad (6)$$

$$A_{\lambda_{ng}} = \quad (7)$$

$$\frac{R_{NG}}{R_{NG} + R_{ph}} \cdot \frac{V_n}{2\pi \cdot f_n} = \begin{cases} 0 \\ \frac{+\infty}{+\infty + R_{ph}} \cdot \frac{V_n}{2\pi \cdot f_n} = \frac{V_n}{2\pi \cdot f_n} \\ \frac{R_{NG}}{R_{NG} + R_{ph}} \cdot \frac{V_n}{2\pi \cdot f_n} = \frac{R_{HRG}}{R_{HRG} + R_{ph}} \cdot \frac{V_n}{2\pi \cdot f_n} \end{cases}$$

In certain implementations, the processor 124 uses the leakage flux linkage amplitude $A_{\lambda_{ng}}$ to identify different grounding scheme shown in equation (7). In certain implementations, moreover, the processor 124 uses the frequency of λng to screen the noise interference from the solid ground. As discussed above, one example uses a resistance value of 90 ohms for the connected load resistor RPH, and any included high resistance grounding resistor RNG will typically have a value of 27-277 ohms. In one example, the leakage flux linkage amplitude $A_{\lambda_{ng}}$ is given by the following equation:

$$A_{\lambda_{ng}} =$$

$$\frac{R_{NG}}{R_{NG} + R_{ph}} \cdot \frac{V_n}{2\pi \cdot f_n} = \left(1 - \frac{1}{1 + \frac{R_{NG}}{R_{ph}}}\right) \cdot \frac{V_n}{2\pi \cdot f_n} = (0.231 \; 0.755) \cdot \frac{V_n}{2\pi \cdot f_n}$$

If the leakage flux linkage amplitude $A_{\lambda_{ng}}$ is between $0.2(V_n/2\pi f_n)$ and $0.8(V_n/2\pi f_n)$ (e.g., between TH1 and TH2), The processor 124 identifies the grounding scheme as HRG grounding.

Figure 5:
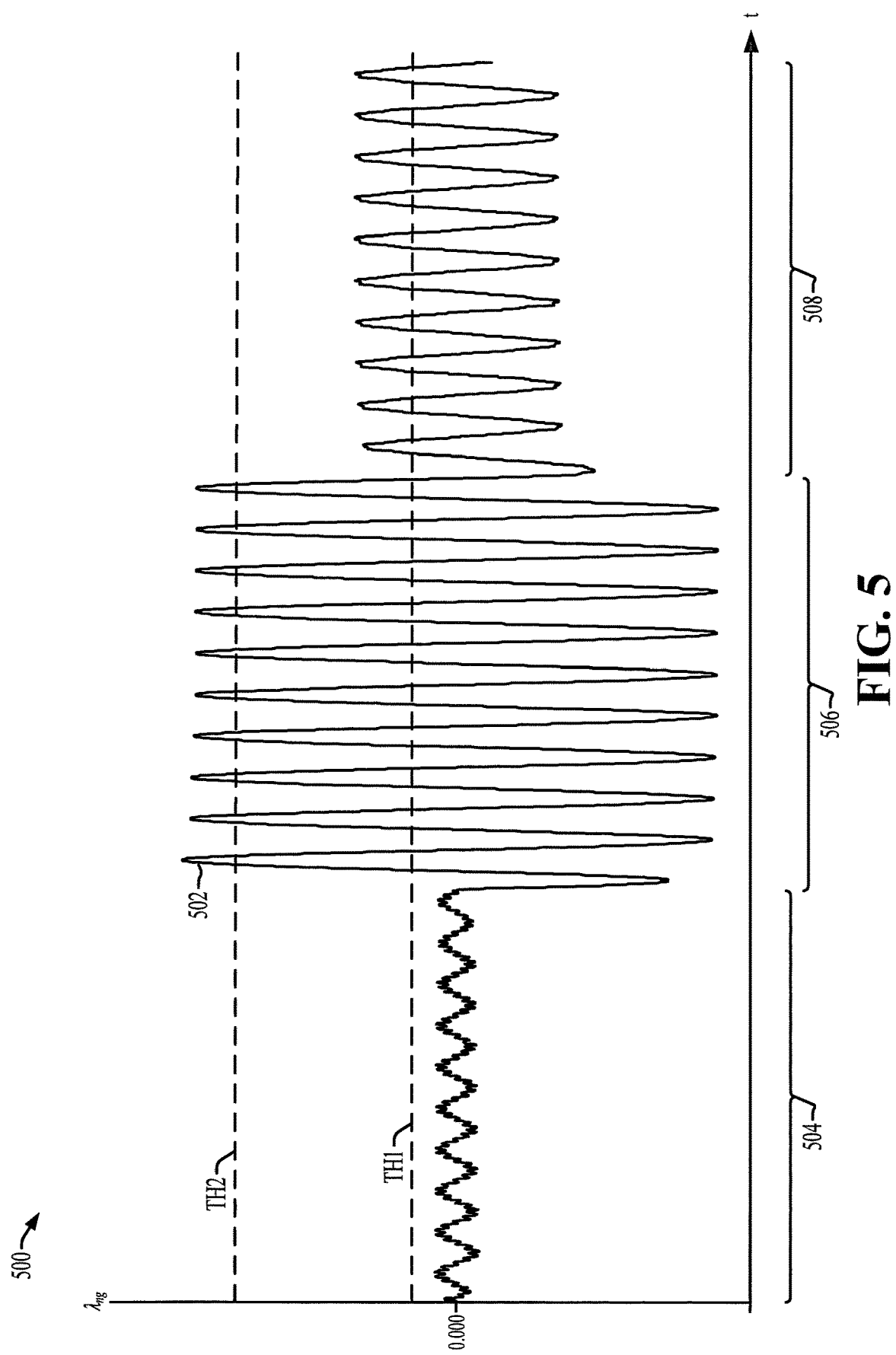
FIGS. 5-8 are signal diagrams.
Figure 6:
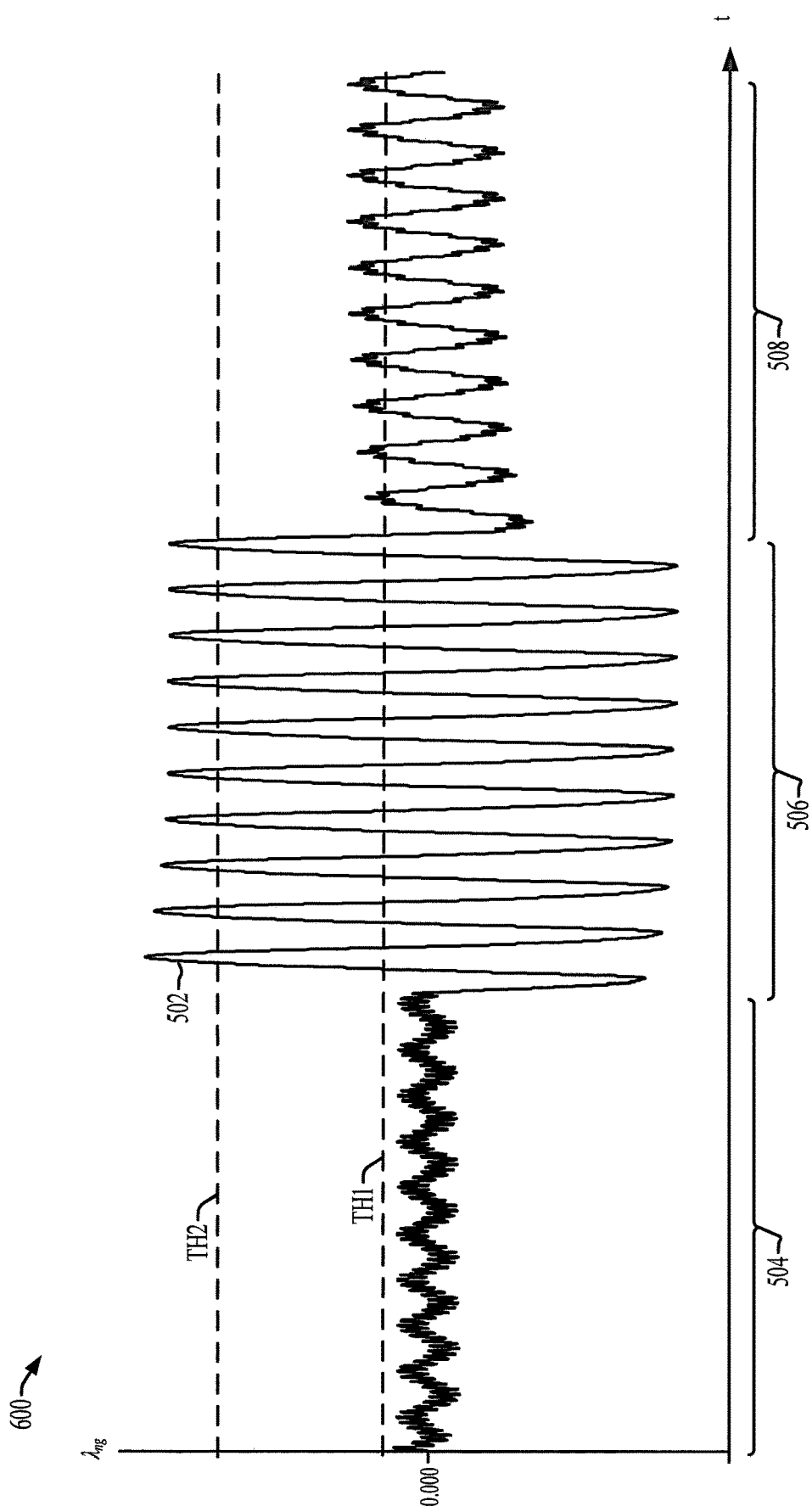
Figure 7:
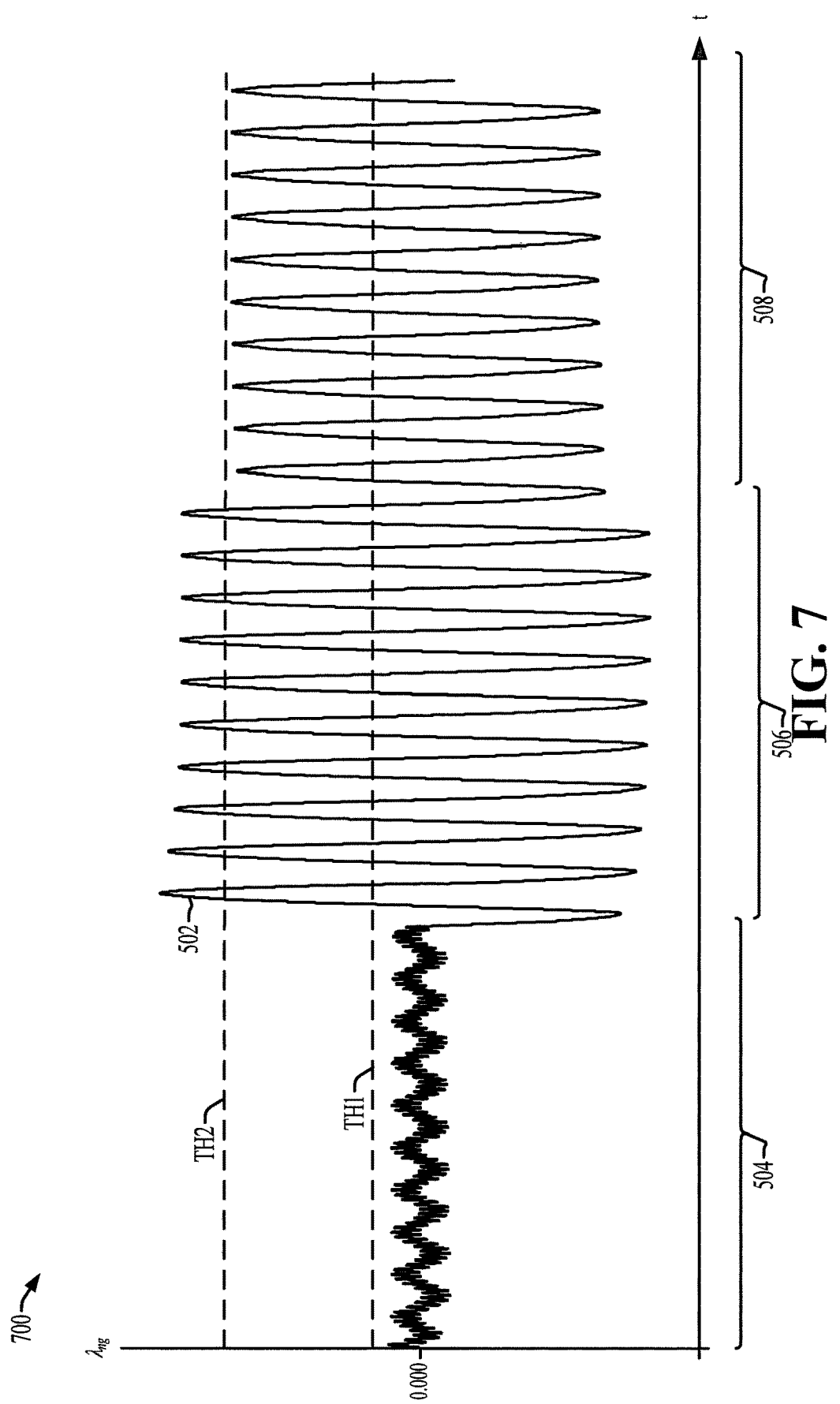
Figure 8:
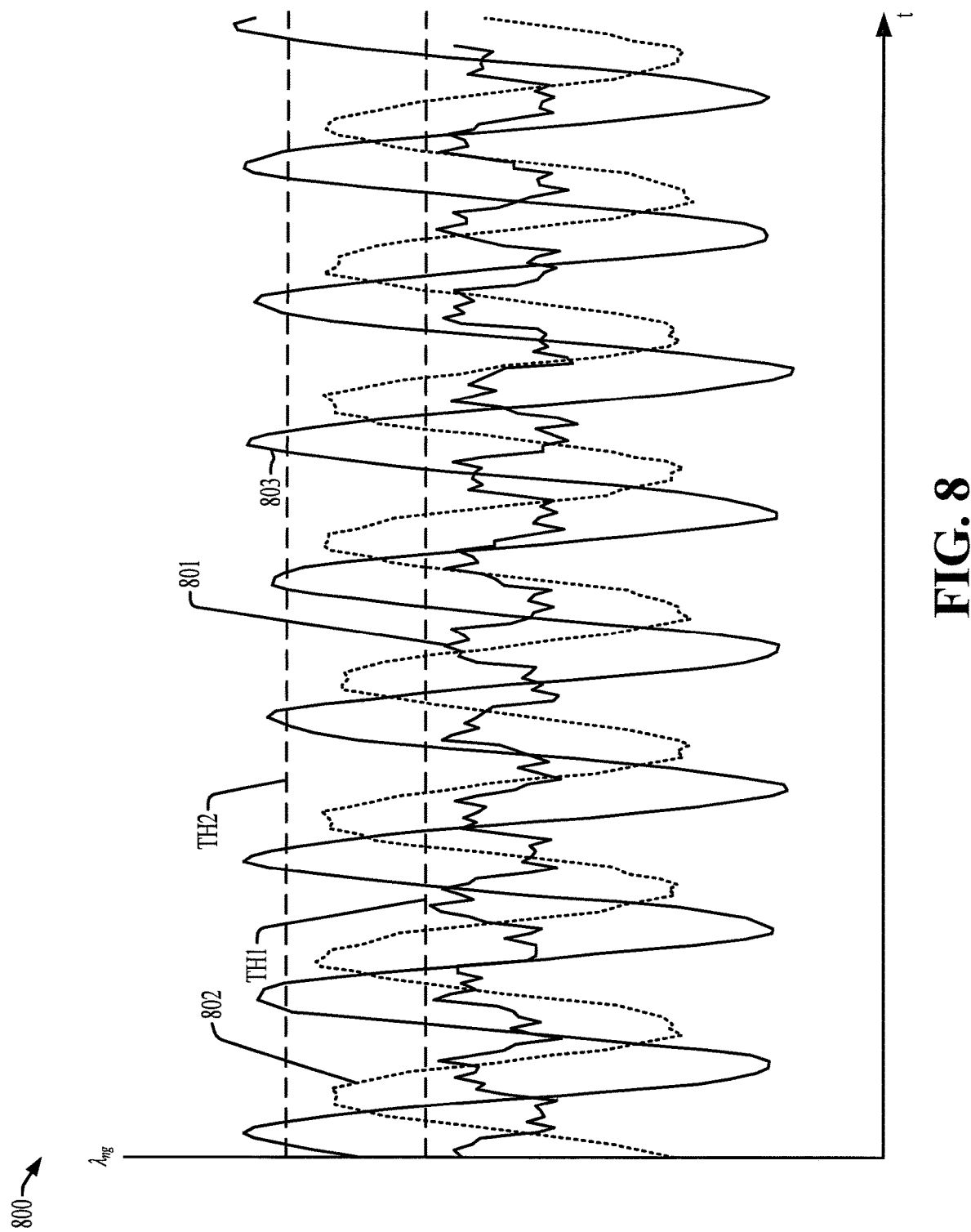

FIGS. 5-8 illustrate non-limiting example graphs showing operation of the controller 120 according to the method 200 above. FIG. 5 provides a graph 500 with a curve 502 showing the leakage flux linkage value λng during motor drive at a predetermined frequency (e.g., 20 Hz) with a 90 ohm load resistor RPH connected between the single phase of the inverter output and the reference node GND. The graph 500 illustrates operation in a first portion 504 in which the system 100 is solid grounded, a second portion 506 in which the system 100 is floating, and a third portion 508 in which the system 100 is high resistance grounded using a 55 ohm resistor RNG. The graph 500 further illustrates example first and second threshold values TH1 and TH2 used by the processor 124 to distinguish between the three different operating modes. A graph 600 in FIG. 6 illustrates another example with a 90 ohm load resistor RPH and a 27 ohm resistor RNG. A graph 700 in FIG. 7 shows another example with a 90 ohm load resistor RPH and a 277 ohm resistor RNG. As seen in FIGS. 5-7, the threshold values can be set in order to distinguish between the various grounding configurations for an expected range of potential HRG grounding resistors RNG. FIG. 8 provides a graph 800 with superimposed curves 801-803 showing the leakage flux linkage value λng during motor drive at a predetermined frequency (e.g., 20 Hz) with a 90 ohm load resistor RPH, together with the threshold values TH1 and TH2. In this example, the curve 801 shows the leakage flux linkage value λng for a solid grounded system operating at a frequency greater than 20 Hz, the curve 802 shows λng for an HRG system with a 180 ohm resistor RNG operating at 20 Hz, and the curve 803 shows 20 Hz operation for a floating system 100.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". This description uses examples to disclose various embodiments and also to enable any person skilled in the art to practice the disclosed subject matter, including making and using any devices or systems and performing any incorporated methods. It will be evident that various modifications and changes may be made, and additional embodiments may be implemented, without departing from the broader scope of the present disclosure as set forth in the following claims, wherein the specification and drawings are to be regarded in an illustrative rather than restrictive sense.

The following is claimed:

1. A motor drive, comprising:
   a filter with an input to receive an AC input signal, an output, and a filter neutral node;
   a rectifier, including an input to receive a filtered AC signal from the filter, and an output to provide a DC bus voltage signal;
   a DC bus circuit, including first and second DC bus capacitors, and a DC bus internal node that joins the DC bus capacitors;
   an inverter, including an inverter input connected to the DC bus circuit, an inverter output; and
   a controller, including a processor configured to execute program instructions from an electronic memory while a load resistor is connected between a single phase of the inverter output and a reference node to automatically:
   operate the inverter using closed loop regulation to maintain constant flux linkage at a predetermined frequency and measure a neutral-ground voltage,
   compute a leakage flux linkage value according to the neutral-ground voltage, and
   determine a grounding configuration of the motor drive according to the leakage flux linkage value.

2. The motor drive of claim 1, wherein the processor is further configured to execute the program instructions to automatically turn the inverter off and measure the neutral-ground voltage while the load resistor is connected between the single phase of the inverter output and the reference node, and to automatically determine whether the motor drive is delta corner grounded according to the neutral-ground voltage.

3. The motor drive of claim 2, wherein the processor is further configured to execute the program instructions to automatically determine that the motor drive is delta corner grounded if the neutral-ground voltage is greater than or equal to half a line-line voltage of the AC input signal.

4. The motor drive of claim 2, wherein the processor is further configured to execute the program instructions to automatically determine that the motor drive is solid grounded if the leakage flux linkage value is less than a first threshold value.

5. The motor drive of claim 4, wherein the processor is further configured to execute the program instructions to automatically determine that the motor drive is floating if the leakage flux linkage value is greater than a second threshold value, the second threshold value being greater than the first threshold value.

6. The motor drive of claim 5, wherein the processor is further configured to execute the program instructions to automatically determine that the motor drive is high-resistance grounded if the leakage flux linkage value is greater than or equal to the first threshold value and the leakage flux linkage value is less than or equal to the second threshold value.

7. The motor drive of claim 1, wherein the processor is further configured to execute the program instructions to automatically determine that the motor drive is solid grounded if the leakage flux linkage value is less than a first threshold value.

8. The motor drive of claim 7, wherein the processor is further configured to execute the program instructions to automatically determine that the motor drive is floating if the leakage flux linkage value is greater than a second threshold value, the second threshold value being greater than the first threshold value.

9. The motor drive of claim 8, wherein the processor is further configured to execute the program instructions to automatically determine that the motor drive is high-resistance grounded if the leakage flux linkage value is greater than or equal to the first threshold value and the leakage flux linkage value is less than or equal to the second threshold value.

10. A controller to automatically determine a grounding condition of a motor drive, comprising:
an electronic memory that stores the program instructions; and
a processor configured to execute the program instructions while a load resistor is connected between a single phase of a motor drive inverter output and a reference node to automatically:
operate an inverter of the motor drive using closed loop regulation to maintain constant flux linkage at a predetermined frequency,
compute a leakage flux linkage value according to a neutral-ground voltage of the motor drive, and
determine a grounding configuration of the motor drive according to the leakage flux linkage value.

11. The controller of claim 10, wherein the processor is further configured to execute the program instructions to automatically turn the inverter off and measure the neutral-ground voltage while the load resistor is connected between the single phase of the inverter output and the reference node, and to automatically determine whether the motor drive is delta corner grounded according to the neutral-ground voltage.

12. The controller of claim 11, wherein the processor is further configured to execute the program instructions to automatically determine that the motor drive is delta corner grounded if the neutral-ground voltage is greater than or equal to half a line-line voltage of the AC input signal.

13. The controller of claim 11, wherein the processor is further configured to execute the program instructions to automatically determine that the motor drive is solid grounded if the leakage flux linkage value is less than a first threshold value.

14. The controller of claim 13, wherein the processor is further configured to execute the program instructions to automatically determine that the motor drive is floating if the leakage flux linkage value is greater than a second threshold value, the second threshold value being greater than the first threshold value.

15. The controller of claim 14, wherein the processor is further configured to execute the program instructions to automatically determine that the motor drive is high-resistance grounded if the leakage flux linkage value is greater than or equal to the first threshold value and the leakage flux linkage value is less than or equal to the second threshold value.

16. The controller of claim 10, wherein the processor is further configured to execute the program instructions to automatically determine that the motor drive is solid grounded if the leakage flux linkage value is less than a first threshold value.

17. The controller of claim 16, wherein the processor is further configured to execute the program instructions to automatically determine that the motor drive is floating if the leakage flux linkage value is greater than a second threshold value, the second threshold value being greater than the first threshold value.

18. The controller of claim 17, wherein the processor is further configured to execute the program instructions to automatically determine that the motor drive is high-resistance grounded if the leakage flux linkage value is greater than or equal to the first threshold value and the leakage flux linkage value is less than or equal to the second threshold value.

19. A method to automatically determine a grounding condition of a motor drive, the method comprising:
operating an inverter using closed loop regulation to maintain constant flux linkage at a predetermined frequency while a load resistor is connected between a single phase of a motor drive inverter output and a reference node;
computing a leakage flux linkage value according to a neutral-ground voltage of the motor drive; and
determining a grounding configuration of the motor drive according to the leakage flux linkage value.

20. The method of claim 19, further comprising:
automatically turning the inverter off and measuring the neutral-ground voltage while the load resistor is connected between the single phase of the inverter output and the reference node; and
automatically determining whether the motor drive is delta corner grounded according to the neutral-ground voltage.

21. The motor drive of claim 1, wherein the processor is further configured to execute the program instructions to automatically determine the grounding configuration of the motor drive as one of solid grounded, high-resistance grounded, or floating according to the leakage flux linkage value.

22. The controller of claim 10, wherein the processor is further configured to execute the program instructions to automatically determine the grounding configuration of the motor drive as one of solid grounded, high-resistance grounded, or floating according to the leakage flux linkage value.

23. The method of claim 19, further comprising:
automatically determining the grounding configuration of the motor drive as one of solid grounded, high-resistance grounded, or floating according to the leakage flux linkage value.

* * * * *